United States Patent [19]

Bhattacharya et al.

[11] Patent Number: 5,815,532
[45] Date of Patent: Sep. 29, 1998

[54] METHOD AND APPARATUS FOR PEAK-TO-AVERAGE RATIO CONTROL IN AN AMPLITUDE MODULATION PAGING TRANSMITTER

[75] Inventors: Bhaskar Bhattacharya, Port Coquitlam; Patricia Fern Kavanagh; Mohammad Aamir Husain, both of Burnaby, all of Canada

[73] Assignee: Glenayre Electronics, Inc., Charlotte, N.C.

[21] Appl. No.: 640,719

[22] Filed: May 1, 1996

[51] Int. Cl.[6] ........................................... G10L 3/02
[52] U.S. Cl. ..................... 375/301; 455/47; 455/109; 332/167; 332/170; 704/225; 381/16
[58] Field of Search .......................... 375/260, 268, 375/270, 285, 295, 296, 297, 300, 301, 345; 332/149, 151, 158, 159, 160, 167, 170; 455/46, 47, 91, 102, 103, 109, 114, 116, 235.1; 370/480, 484; 381/2, 15, 16, 106; 395/2.34, 2.1; 704/201, 225

[56] References Cited

U.S. PATENT DOCUMENTS

| | | |
|---|---|---|
| 4,853,963 | 8/1989 | Bloy et al. ............................ 381/31 |
| 5,045,799 | 9/1991 | Holecek . |
| 5,241,689 | 8/1993 | Schwed et al. . |
| 5,287,387 | 2/1994 | Birchler . |
| 5,302,914 | 4/1994 | Arutz et al. . |
| 5,381,449 | 1/1995 | Jasper et al. . |
| 5,390,338 | 2/1995 | Bodin et al. . |
| 5,422,597 | 6/1995 | Stengel et al. . |
| 5,471,651 | 11/1995 | Wilson . |
| 5,491,727 | 2/1996 | Petit . |
| 5,638,403 | 6/1997 | Birchler et al. ..................... 375/296 |

*Primary Examiner*—Don N. Vo
*Assistant Examiner*—Amanda T. Le
*Attorney, Agent, or Firm*—Christensen, O'Connor Johnson & Kindness PLLC

[57] ABSTRACT

A method and apparatus for reducing peak-to-average power ratio in a paging transmitter broadcasting an independent sideband amplitude modulation protocol is disclosed. A digital signal, for example a digital voice signal, is provided to a control gain generator which generates a digital gain sequence. The digital gain sequence is such that during peak values in the digital signal the gain is low and during low values in the digital signal the gain is high. The digital gain sequence is multiplied with the digital signal to compress the dynamic range of the digital signal.

18 Claims, 4 Drawing Sheets

METHOD AND APPARATUS FOR PEAK-TO-AVERAGE RATIO CONTROL IN AN AMPLITUDE MODULATION PAGING TRANSMITTER

FIELD OF THE INVENTION

The present invention relates to a paging transmitter for broadcasting amplitude modulated voice signals, and more particularly, a paging transmitter that reduces the peak-to-average power ratio of the transmitted signal.

BACKGROUND OF THE INVENTION

Amplitude modulation (AM) is a modulation technique that has been commonly used to transmit voice or data. In amplitude modulation, the amplitude of a carrier frequency is varied in order to transmit information. Recently, it has been suggested that a multichannel, independent sideband, suppressed carrier amplitude modulation technique be used to transmit voice pages to a pager. The general operation of a paging system is well known in the art and reference is made to U.S. Pat. No. 5,481,258 entitled "METHOD AND APPARATUS FOR COORDINATING CLOCKS ON THE SIMULCAST NETWORK" to Fawcett et al., assigned to the assignee herein and incorporated by reference.

One characteristic of voice signals is that the voice signals tend to have a large dynamic range in terms of amplitude (and therefore power) of the voice signal. The dynamic range for power of a voice signal can be as much as 30 dB or a factor of 1000 difference between minimum and maximum power. The ratio of the peak signal power and the average signal power is referred to as peak-to-average power ratio.

For single sideband (SSB) suppressed carrier amplitude modulation, the large dynamic range of voice signals introduces various problems. As is known by those skilled in the art, a conventional single sideband system operates basically as follows. The base band voice signal is first used to amplitude modulate a carrier signal by means of a mixer. The output of the mixer is then filtered to select one sideband thereof. In addition, the carrier frequency is suppressed. The resulting single sideband signal is then amplified and transmitted to a receiver. In the case of a paging system, the receiver is a mobile pager. The pager demodulates the transmitted signal back down to base band and recovers the voice signal. Because only one sideband is transmitted, more efficient use of the radio frequency spectrum is achieved.

Although single sideband is relatively spectrum efficient, a conventional single sideband system as described above is not optimized for pager communications. The peak-to-average power ratio of conventional single sideband voice signals as just described is unacceptably high. This results in the requirement of a transmitter with a wide range linear amplitude transfer characteristic. In addition, because of the nature of single sideband suppressed carrier amplitude modulation, the transmitted power by a paging transmitter is dependent on the envelope of the voice signal. This leads to the result that quietly spoken voice signals would not be transmitted as powerfully as loudly spoken voice messages.

Another difficulty that arises from the use of single sideband suppressed carrier amplitude modulation to transmit voice signals is that because of the large dynamic range of a voice signal, the power rating of the paging transmitter must accommodate the peak signal power. However, relatively rarely is the paging transmitter operating to transmit peak signal power. During most of the time, the paging transmitter is operating well below the peak signal power level. This results in the paging transmitter operating in an inefficient manner since the supply power provided is high compared to the amount of power actually transmitted. Moreover, the paging transmitter is also significantly more expensive because it must be designed to transmit at a high signal power level.

Significant cost and operational efficiencies can be achieved if the peak-to-average power ratio of the voice signal to be transmitted can be reduced. This allows the paging transmitter to be operated closer to optimal efficiency.

SUMMARY OF THE INVENTION

A method for reducing the peak-to-average power ratio of a plurality of amplitude modulated voice signals for broadcast by a paging transmitter is disclosed. The method comprising the steps of: calculating an associated first gain sequence for each of said plurality of voice signals, said associated first gain sequence dependent upon the corresponding voice signal; for each of said plurality of voice signals, multiplying the voice signal with said associated first gain sequence to provide a first compressed voice signal; modulating pairs of said first compressed voice signal to produce at least one independent sideband signal; calculating a second gain sequence for each of said independent sideband signals; multiplying said second gain sequence with said independent single sideband signal to form at least one second compressed voice signal; and multiplying each of said second compressed voice signals with an assigned predetermined carrier frequency to provide an output signal for broadcast.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
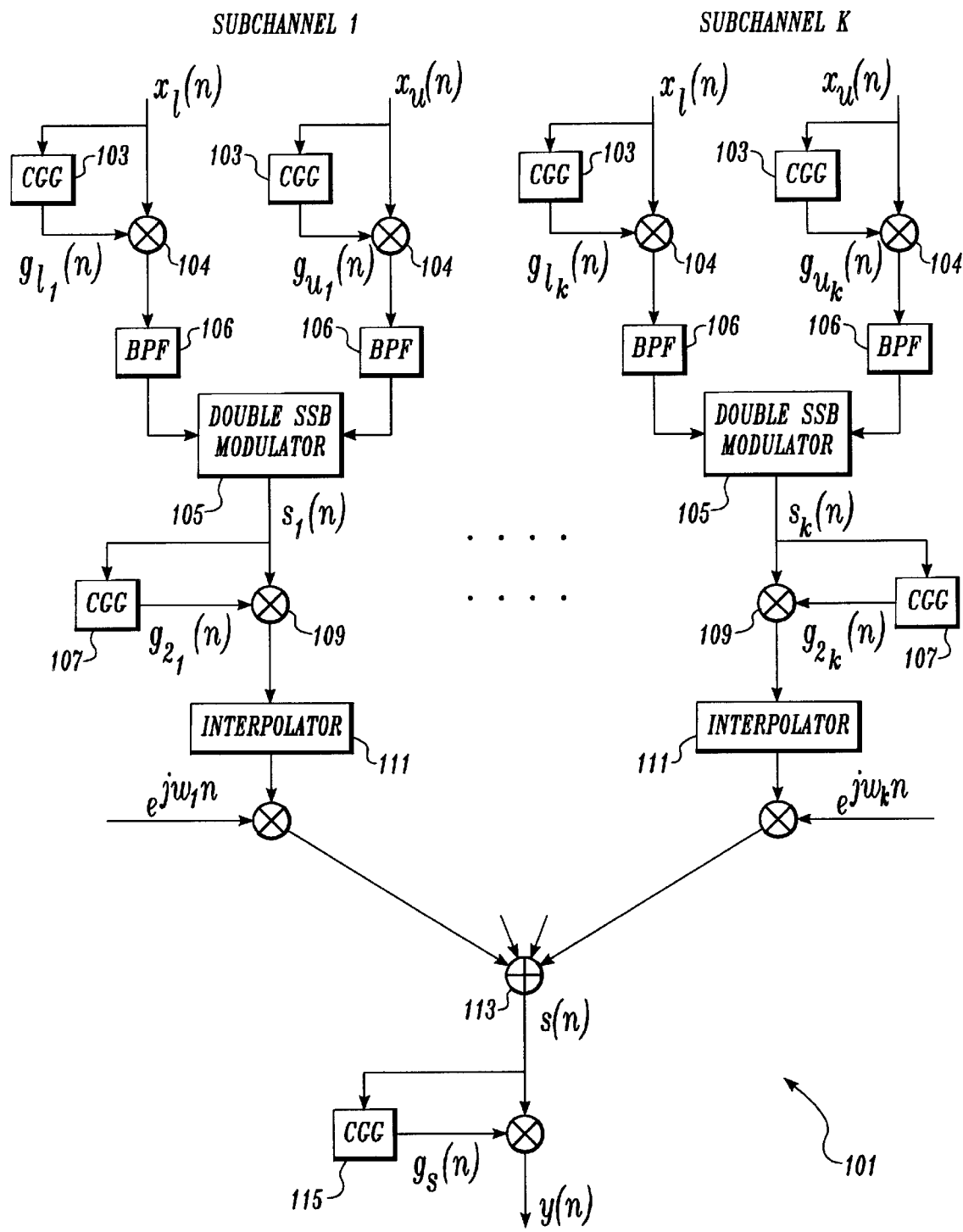
FIG. 1 is a schematic illustration of the preferred embodiment of the present invention.

Turning to FIG. 1, a schematic diagram of the preferred embodiment of the present invention is shown. The apparatus shown in FIG. 1 is resident in a paging transmitter of a paging system and, indeed, in the preferred embodiment, the apparatus of FIG. 1 is implemented as software running on a digital signal processor.

As shown in FIG. 1, the present invention is directed towards a peak-to-average power ratio reduction method and apparatus that operates on a multichannel, independent, single sideband, suppressed carrier, amplitude modulation system. Subchannels 1 through K can each carry two voice transmissions, one on a lower sideband and one on an upper sideband. For clarity, only two subchannel processing branches are shown. It can be appreciated that the present invention is operable with K being any arbitrary integer number, with suitable replication of the processing circuitry shown in FIG. 1.

It should be noted that there is inherent reduction in the peak-to-average ratio resulting from the combining process of the upper and lower sidebands of a subchannel. It is statistically unlikely that the two voice signals on the lower and upper sidebands of a subchannel will be at the same level at the same time. This random nature of the magnitude of the signal on the lower and upper sidebands tends to reduce the peak-to-average ratio. Similarly, it is statistically unlikely that the power levels on the subchannels will be at the same level at the same time. This random nature of the magnitude of the signal on the subchannels also tends to reduce the peak-to-average ratio.

The signals denoted $x_1(n)$ and $x_u(n)$ are digital samples of an analog voice signal to be transmitted, referred to herein as input digital sequences. The signal $x_1(n)$ is destined to be modulated on the lower single sideband and the signal $x_u(n)$ is destined to be modulated on the upper single sideband. Typically, the input digital sequences $x_1(n)$ and $x_u(n)$ are provided by other circuitry in the paging system.

For example, a caller to a paging terminal will leave a voice message with the paging terminal. The paging terminal will digitize the analog voice signal to provide the input digital sequences $x_1(n)$ and $x_u(n)$. These input digital sequences are then distributed to the paging transmitters in the paging system for transmission by means of a link system. In the preferred embodiment, the sampling rate of the analog voice signal is 8,000 Hz. As can be appreciated by those skilled in the art, a typical filtered voice signal as passed through a public switched telephone network has frequency components in the 300 Hz to 3,400 Hz range. By sampling at 8,000 Hz, i.e., more than twice the frequency of the highest frequency signal, it is possible to generate an accurate input digital sequence.

Upon receipt of the input digital sequences $x_1(n)$ and $x_u(n)$, the paging transmitter will in accordance with its standard procedures queue up the input digital sequences for modulation and transmission at the appropriate time. At that time, taking the lower subband branch first, the input digital sequence $x_1(n)$ is provided to a control gain generator 103. The control gain generator, as will be seen in greater detail below, provides a digital gain sequence $g_{11}(n)$ that is provided to multiplier 104. Also provided as input to multiplier 104 is the input digital sequence $x_1(n)$. The multiplier 104 produces a digital sequence that is the product of its inputs, in this case, the input digital sequence $x_1(n)$ and the digital gain sequence $g_{11}(n)$. The multiplier 104 is also referred to in the art as a product modulator.

In general terms, the control gain generator 103 outputs a gain sequence that, when multiplied with the input digital sequence $x_1(n)$, tends to minimize high amplitude signals in the input digital sequence $x_1(n)$ and maximize low amplitude signals in the input digital sequence $x_1(n)$. Thus, during this first stage of peak-to-average power ratio reduction, the input digital sequence $x_1(n)$ tends to be compressed about a median signal amplitude. In the preferred embodiment, this compressed range is biased towards the maximum end of the amplitude range. This tends to reduce the peak-to-average power ratio of the digitized voice signal. The process described above is repeated in all of the lower and upper sidebands throughout each of the subchannels 1 to K.

Figure 4:
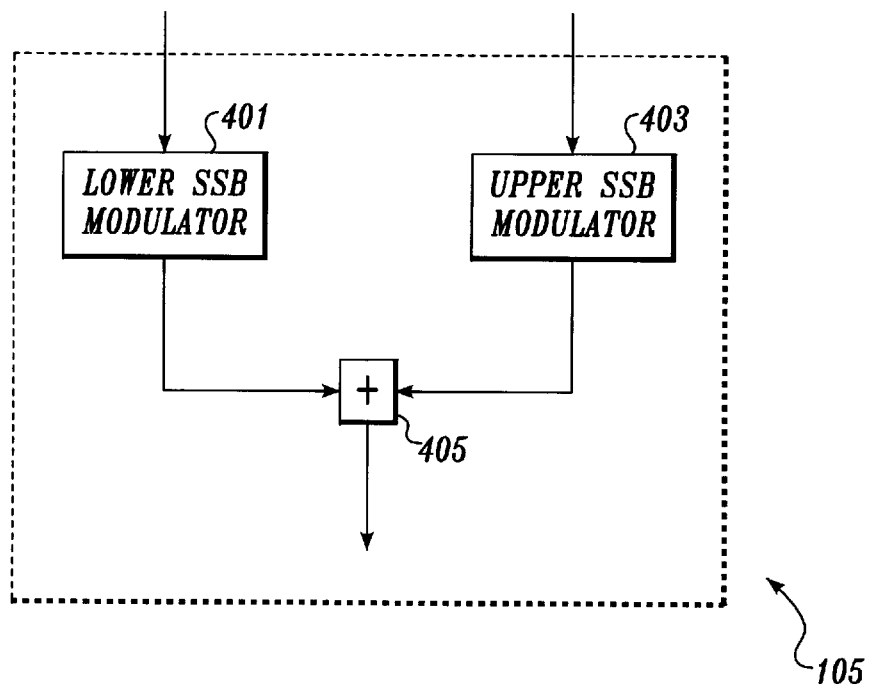
FIG. 4 is a detailed schematic illustration of a double SSB modulator used in the present invention.

After the first stage of peak-to-average power ratio reduction, the discrete sequences of each subchannel output by each multiplier 104 are bandpass filtered by band pass filter 106 and are then input into the double single sideband modulator 105. The modulator, shown in greater detail in FIG. 4, is formed in accordance with known techniques in the art. In operation, the double single sideband modulator 105 combines the lower and upper sideband discrete sequences output from the multiplier 104 into a single modulated signal. The double SSB modulator 105 includes a lower SSB modulator 401, an upper SSB modulator 403, and a summer 405.

In the case of subchannel 1, the single modulated signal output by the double SSB modulator 105 is referred to as $s_1(n)$. The modulated signal $s_1(n)$ includes the lower and upper sideband signals output from the multipliers 104. The output of the modulator 105, $s_1(n)$, is then provided to a second control gain generator 107. This control gain generator is functionally the same as the control gain generator 103 of the previous stage. However, it may be that certain predetermined parameters are different for this particular second control gain generator 107. It should be noted that the modulated signals $s_1(n)$ through $s_k(n)$ are complex signals. This results from the modulation process of the modulator 105.

As in the first stage of peak-to-average power ratio reduction, the control gain generator 107 provides a second digital gain sequence $g_2(n)$ that is input into a second stage multiplier 109. The other input to the second stage multiplier 109 is the modulated signal $s_1(n)$. The second stage multiplier 109 generates an output that is the product of the input sequences. Because the modulated signal $s_1(n)$ is complex, the output of the second stage multiplier 109 is also complex. This further tends to minimize high amplitude signals in the voice signals and maximize low amplitude signals in the voice signals. Thus, during this second stage of peak-to-average power ratio reduction, the digitized voice signals are further compressed about a median signal amplitude. In the preferred embodiment, the range is biased towards the maximum of the amplitude range. This further reduces the peak-to-average power ratio of the digitized voice signal.

Next, the signal output by the second stage multiplier 109 is then provided to an interpolator 111 that interpolates, in accordance with known techniques, the 8000 Hz signal into a 80000 Hz signal. The sampling frequency is thus raised to a value sufficient to contain enough samples to describe the increased range of frequencies which exists after the combining of the individual subcarriers produced as described below. After the interpolation, the signal is then mixed with the carrier frequency for that particular subchannel carrier frequency $e^{j\omega_1 n}$ in order to shift the upper and lower sideband signal such that it is centered around the carrier frequency. As can be appreciated by those skilled in the art, the carrier frequency used for the mixing is variable depending upon which subchannel is being broadcast. Thus, for subchannel K, the mixing frequency is $e^{j\omega_k n}$. The effect of the mixing with the varying carrier frequencies is to frequency multiplex the subchannels.

All of the signals from the subchannels are then summed by summer 113 to provide a combined multichannel output signal s(n). It can be appreciated by those skilled in the art that the summer 113 serves to complete the frequency multiplexing of the subchannels 1 to K. The combined multichannel output signal s(n) is then provided to a third stage control gain generator 115. The control gain generator 115 provides another digital gain sequence $g_s(n)$ that is used to multiply with the multichannel output signal s(n) to provide a final output sequence y(n). The final output signal y(n), still being a complex signal, is then further processed and provided, after conversion to an analog signal, to the power amplifier of the paging transmitter for broadcast. Details of the further processing of the signal y(n) can be found in copending application entitled LINEAR TRANS- MITTER USING PREDISTORTION filed on Feb. 14, 1996 and accorded Ser. No. 08/601,118, assigned to the assignee of the present invention and herein incorporated by reference.

Note that the reduction in the peak-to-average power ratio is accomplished in three stages: first, at the outset to the input digital sequences $x_l(n)$ and $x_u(n)$, second, after the double independent single sideband modulator 105, and third, after the frequency multiplexing of summer 113. The reduction in peak-to-average power by each of these stages causes a distortion in the voice signal. It has been found that it is not possible to apply all of the peak-to-average power reduction in a single stage without significantly distorting the voice signal. Therefore, it is preferable to apply a smaller amount of peak-to-average reduction in multiple stages.

It also should be noted that one of the undesirable effects produced by the multiplication of a signal by another signal is the widening of the bandwidth of the original signal. In the case of the first stage, when the input digital sequence $x_l(n)$ and $x_u(n)$ are multiplied by the digital gain sequences $g_l(n)$ and $g_u(n)$, respectively, the bandwidth of the resultant product signal has a widened bandwidth. The extent of bandwidth widening is dependent upon the bandwidth of the digital gain sequences $g_l(n)$ and $g_u(n)$. If the widening is pronounced, the effect may be that the upper and lower sidebands output by the SSB modulator 105 overlap each other causing unwanted interference or crosstalk.

In order to solve this difficulty, optional bandpass filters may be used following the output of the multipliers 104. These bandpass filters serve to limit the bandwidth of the signals output by multipliers 104, and hence, the input into SSB modulators 105. Similarly, after the second stage multipliers 109, an optional bandpass filter may be used to limit the widening of the bandwidth of the modulated signals $s_1(n)$ through $s_k(n)$. In addition, band pass filters may be used at any one of several intermediate points in FIG. 1 to ensure no undue spectral widening.

Finally, as noted above, the signal y(n) is provided to other portions of the paging transmitter for processing and transmission. The further processing often includes further band pass filtering of the y(n) signal to ensure that the signal y(n) meets the spectral mask dictated by, for example in the U.S., the Federal Communications Commission. It should also be noted that each of the band pass filters 106, 206 and 211 (of FIG. 2 below) are all linear phase filters.

Figure 2:
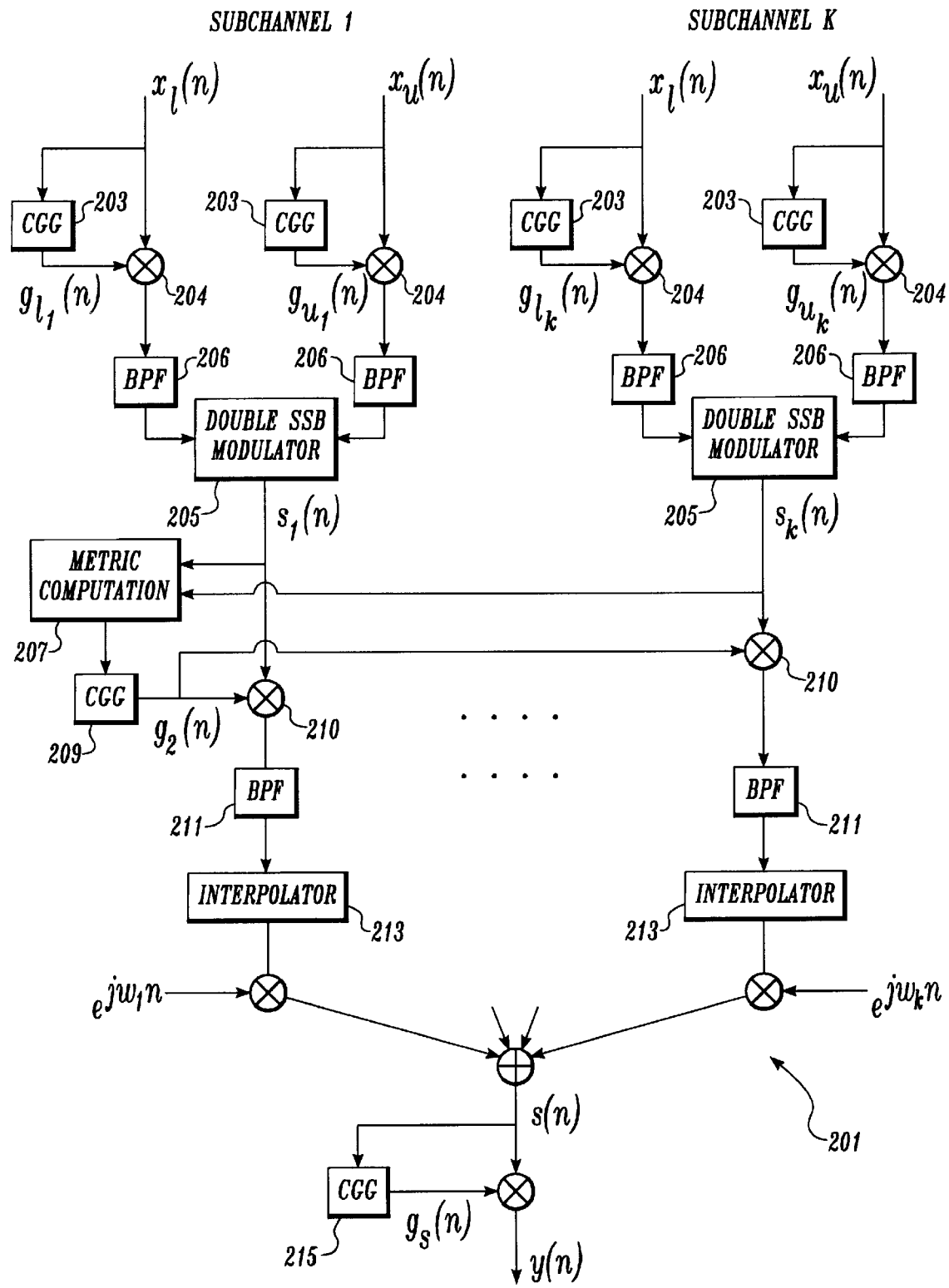
FIG. 2 is a schematic illustration of an alternative embodiment of the present invention.

Turning now to FIG. 2, an alternative embodiment of the present invention is shown. To understand why this embodiment may be preferable to the embodiment shown in FIG. 1, referring back to FIG. 1, the third stage control gain generator 115 applies a control gain to the sum of the several subchannels s(n). This will produce widening of each subchannel spectra and consequently some cross-talk between adjacent subchannels. This alternative embodiment significantly circumvents this problem by estimating a common control gain for all subchannels during the second stage of peak-to-average power ratio reduction by applying the same control gain to each subchannel before they are summed by the summer. This allows more compression to be applied at this stage and less at the output of the summer 113.

Specifically, turning to FIG. 2, like the embodiment shown in FIG. 1, the control gain generators 203 and multipliers 204 operate to initially compress the dynamic range of the input digital sequences $x_l(n)$ and $x_u(n)$. The double single sideband modulator 205 combines the two independent sidebands into a single complex modulated signal $s_1(n)$. All of the modulated signals, $s_1(n)$ and $s_k(n)$, from each of the subchannels are then provided to a metric computation block 207 that performs a predetermined metric on the signals. The metric computation block 207 provides a good composite representation of the dynamic range of the signals $s_1(n)$ through $s_k(n)$. The composite signal is then provided to the control gain generator 209 that provides a uniform digital gain sequence $g_2(n)$ to each of the subchannels.

In the preferred embodiment, the metric used is:

$$\|s_1(n)\|+\|s_2(n)\|+ \ldots +\|s_k(n)\|$$

Thus, the metric computation block 207 forms a sequence based upon the sum of the magnitudes of the input sequences.

Next, a band pass filter 211 may be used to reduce the spectral broadening caused by the multiplication with the digital gain sequence $g_2(n)$. All of the subchannel signals are then summed and then a third stage of control gain generation is performed on the signal to provide an output signal y(n). This stage produces only a small amount of additional compression, which limits the crosstalk produced to an acceptable limit. Its main purpose is to soft limit the maximum power to avoid exceeding the input capability of the transmitter amplifier. Like the embodiment of FIG. 1 above, band pass filtering may be used at a number of junctures within the system of FIG. 2 to limit spectral widening.

Figure 3:
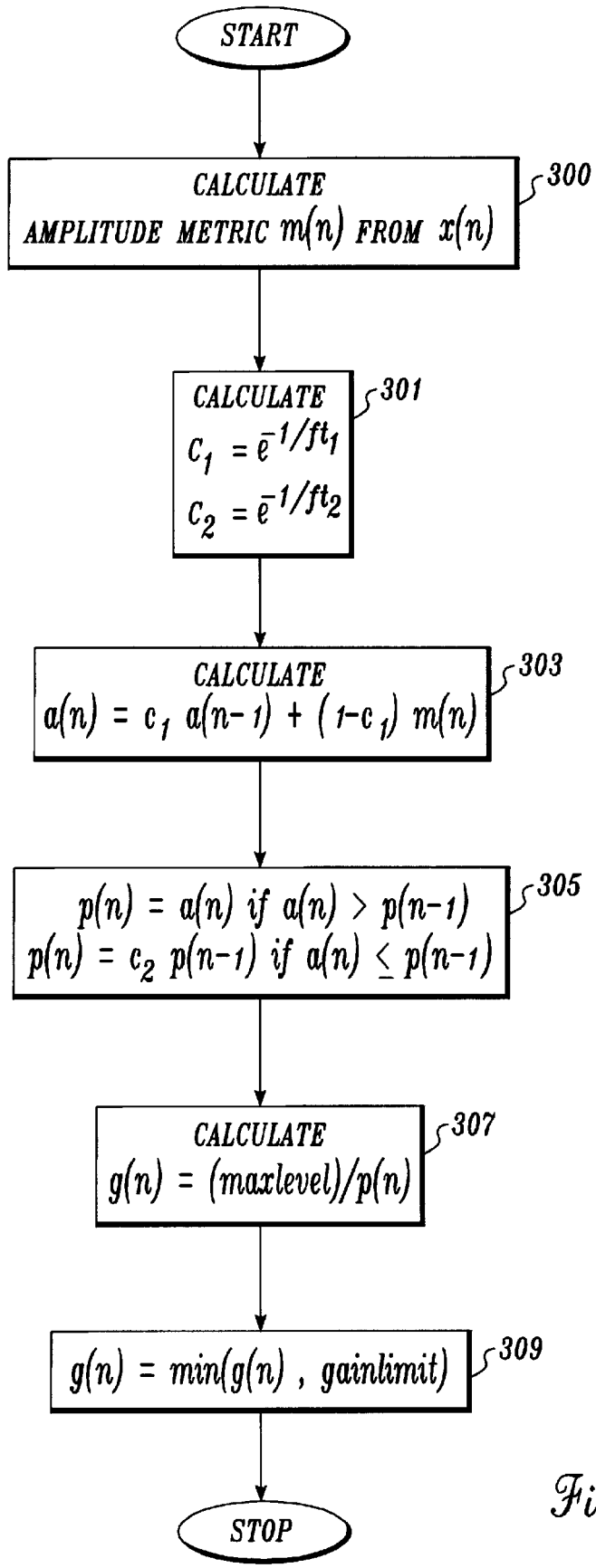
FIG. 3 is a flow diagram illustrating the operation of the control gain generator used in the present invention.

Turning next to FIG. 3, the specific procedure of the control gain generators used in the present invention is shown. Initially, at box 300, a metric function m(n) is generated to describe the magnitude of the sample x(n). Then, at box 301, two constants are calculated for use in the control gain generator. These constants are defined as follows:

$$c_1 = e^{-\frac{1}{fT_1}}$$

$$c_2 = e^{-\frac{1}{fT_2}}$$

where f is the sampling frequency and $T_1$ and $T_2$ are predetermined constants. As noted above, in the preferred embodiment, f is equal to 8,000 Hz. The constants $T_1$ and $T_2$ are in units of time. The parameter $T_1$ is referred to as the "attack time constant" and the parameter $T_2$ is referred to as the "decay time constant."

After the constants $c_1$ and $c_2$ have been calculated, at box 303, a filter response signal a(n) is calculated in accordance with:

$$a(n)=c_1 a(n-1)+(1-c_1)m(n)$$

where m(n) describes the magnitude of the input signal x(n) to the control gain generator, $c_1$ is the constant calculated above, and a(n−1) is the value of the function a(n) during the previous sampling period. Thus, in the embodiment shown in FIG. 1, the input signal of the first control gain generator 103 is $x_l(n)$ and $x_u(n)$, the input signal of the second control gain generator 107 is $s_1(n)$, and the input signal of the third control gain generator 115 is s(n).

As can be seen from the above equation, the filter response signal a(n) is equal to the filter response signal for the previous sample period times the factor $c_1$ plus the current value of the input signal multiplied by $(1-c_1)$. Because $c_1$ is always between 1 and 0, the filter response signal is based on the filter response of the previous sample period and the current value of the input signal.

For extreme values of $T_1$, various generalizations can be seen. For example, if $T_1$ is set equal to 0, then $c_1$ is equal to 0. This then results in the filter response signal a(n) being equal to the input signal x(n). Alternatively, if the value of $T_1$ is made very large, $c_1$ is equal to one. In such a case, the filter response signal a(n) is some constant.

Next, at box 305, an intermediate function p(n) is defined as:

$$p(n)=a(n) \text{ if } a(n)>p(n-1)$$

$$p(n)=c_2 p(n-1) \text{ if } a(n) \leq p(n-1)$$

Thus the intermediate value p(n) is equal to the filter response signal a(n) only if the filter response signal for that sample period is greater than the value of the intermediate value p(n) for the previous sample period. However, if not then p(n) is equal to the previous value of p(n) for the preceding sample period multiplied with the constant $c_2$.

Next, at box 307, the digital gain sequence g(n) output by the control gain generator is defined to be:

$$g(n)=\text{MAXLEVEL}/p(n)$$

where MAXLEVEL is a predetermined constant that limits the upper limit of the amplitude of the input signal after processing.

Based upon the equations set forth above, it can be seen that the signal p(n) is larger for high amplitude input signals and smaller for low amplitude input signals. Hence the digital gain sequence g(n) is large for low amplitude signals and small for high amplitude signals, thereby tending to reduce the dynamic range of the input sequence x(n) when multiplied together.

Finally, at box 309, a limiting step is performed. In particular, the maximum value of g(n) is limited by a predetermined value referred to as GAINLIMIT. Thus, in mathematical terms, the digital gain sequence g(n) is given by:

$$g(n)=\min\left(g(n), \text{GAINLIMIT}\right)$$

The foregoing describes the general operation of each of the control gain generators illustrated in FIGS. 1 and 2. However, it can be appreciated that the various predetermined parameters such as the attack time constant, decay time constant, MAXLEVEL, and GAINLIMIT are adjusted to optimize the system. In the preferred embodiment shown in FIG. 1, the attack time constant for the first control gain generator 103, second control gain generator 107 and third control gain generator 115 are all set to zero. In the first control gain generator 103, the decay time constant $T_2$ is preferably set at two milliseconds, the gain limit is set at 2 and MAXLEVEL is set at 4250. At the second control gain generator 107, the decay time constant $T_2$ is preferably set at five milliseconds, the gain limit constant is preferably set to 2.5, and the MAXLEVEL constant is preferably set at 0.5. Finally, at the third control gain generator 115, the decay time constant $T_2$ is preferably set at 80 milliseconds, the gain limit constant set at 1.0, and the MAXLEVEL constant set at 0.8.

For the alternative embodiment shown in FIG. 2, the attack time constant $T_1$ for both the first control gain generator 203 and second control gain generator 209 is set at 0. At the first control gain generator 203, the decay time constant $T_2$ is set at two milliseconds, the gain limit constant is set at 2 and the MAXLEVEL constant is set at 4250. At the second control gain generator 209, the decay time constant $T_2$ is set at one millisecond, the gain limit constant is set at 3.5 and the MAXLEVEL constant is set at 0.5.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for reducing the peak-to-average power ratio of a plurality of amplitude modulated voice signals for broadcast by a paging transmitter, the method comprising the steps of:

(a) calculating an associated first gain sequence for each of said plurality of voice signals, said associated first gain sequence dependent upon the corresponding voice signal;

(b) for each of said plurality of voice signals, multiplying the voice signal with said associated first gain sequence to provide a first compressed voice signal;

(c) modulating at least one pair of said first compressed voice signal to produce at least one independent single sideband signal;

(d) calculating a second gain sequence for each of said at least independent single sideband signals;

(e) multiplying said second gain sequence with said independent single sideband signal to form at least one second compressed voice signal; and (f) multiplying each of said second compressed voice signals with an assigned predetermined carrier frequency to provide an output signal for broadcast.

2. The method of claim 1 further including the step of bandpass filtering said first compressed voice signal and said second compressed voice signal so as to limit the bandwidth thereof to a predetermined value.

3. The method of claim 1 further including the step of interpolating said second compressed voice signal prior to multiplication to said carrier frequency.

4. The method of claim 1 wherein more than one said output signal is produced and further including the step of frequency multiplexing said output signals into a multichannel output signal.

5. The method of claim 4 wherein said steps of calculating the first digital gain sequence and the second digital gain sequence includes the steps of:

(a) calculating a first constant ($c_1$) based upon a predetermined sampling frequency and a first predetermined time constant;

(b) calculating a second constant ($c_2$) based upon said predetermined sampling frequency and a second predetermined time constant;

(c) calculating a filter response signal based as:

$$a(n)=c_1 a(n-1)+(1-c_1)m(n)$$

where n is an integer and m(n) is some metric of each of said plurality of voice signals in the case of the first digital gain sequence and each of said independent single sideband signals in the case of the second digital gain sequence;

(d) calculating an intermediate function as:

$$p(n)=a(n) \text{ if } a(n)>p(n-1)$$

$$p(n)=c_2 p(n-1) \text{ if } a(n) \leq p(n-1); \text{ and}$$

(e) calculating the digital gain sequence as:

$$g(n) = \text{MAXLEVEL}/p(n),$$

where MAXLEVEL is a predetermined constant.

6. The method of claim 5 further including the step of limiting the maximum value of the digital gain sequence to a predetermined GAINLIMIT.

7. The method of claim 5 further including the step of bandpass filtering said first compressed voice signal and said second compressed voice signal so as to limit the bandwidth thereof to a predetermined value.

8. The method of claim 1 further including the steps of:
   (a) calculating a third gain sequence for said output signal; and
   (b) multiplying said third gain sequence with said output signal to form a third compressed output signal.

9. A method for reducing the peak-to-average power ratio of an amplitude modulated voice signal for broadcast by a paging transmitter, the method comprising the steps of:
   (a) calculating a gain sequence for said voice signal, said gain sequence dependent upon said voice signal, said gain sequence calculated by:
      (i) calculating a first constant ($c_1$) based upon a predetermined sampling frequency and a first predetermined time constant;
      (ii) calculating a second constant ($c_2$) based upon said predetermined sampling frequency and a second predetermined time constant;
      (iii) calculating a filter response signal based as:

$$a(n) = c_1 a(n-1) + (1-c_1) m(n)$$

where n is an integer and m(n) is a metric of said voice signal;
      (iv) calculating an intermediate function as:

$$p(n) = a(n) \text{ if } a(n) > p(n-1)$$

$$p(n) = c_2 p(n-1) \text{ if } a(n) \leq p(n-1); \text{ and}$$

(v) calculating the gain sequence as:

$$g(n) = \text{MAXLEVEL}/p(n),$$

where MAXLEVEL is a predetermined constant, and
   (b) multiplying said voice signal with said gain sequence to provide a compressed voice signal.

10. The method of claim 9 further including the step of limiting the maximum value of the digital gain sequence to a predetermined GAINLIMIT.

11. A method for reducing the peak-to-average power ratio of a plurality of amplitude modulated voice messages broadcast by a paging transmitter, said amplitude modulated voice messages frequency multiplexed onto a plurality of subchannels, each subchannel including a lower sideband and an upper sideband, the method comprising the steps of:
   (a) generating a plurality of input digital sequences, each of said input digital sequences representative of a voice message to be broadcast by said paging transmitter;
   (b) providing each of said plurality of input digital sequences to a corresponding control gain generator, said corresponding control gain generator outputting a first digital gain sequence;
   (c) multiplying each of said input digital sequences with said first digital gain sequence from said corresponding control gain generator to form a first compressed digital sequence;
   (d) providing pairs of said first compressed digital sequences to a corresponding double single sideband modulator, said corresponding modulator outputting a modulated digital sequence comprising of an independent lower sideband and an independent upper sideband;
   (e) providing said modulated digital sequence to a second control gain generator, said second control gain generator outputting a second digital gain sequence;
   (f) multiplying said modulated digital sequence with said second digital gain sequence from said corresponding second control gain generator to form a second compressed digital sequence;
   (g) mixing said second compressed digital sequence with a carrier frequency to form a digital transmission signal; and
   (h) summing said digital transmission signal to achieve frequency multiplexing of said subchannels.

12. The method of claim 11 further including the steps of:
   (a) calculating a third gain sequence for said digital transmission signal; and
   (b) multiplying said third gain sequence with said digital transmission signal to form a third compressed digital transmission signal.

13. An apparatus for reducing the peak-to-average power ratio of a plurality of amplitude modulated voice signals for broadcast by a paging transmitter, the apparatus comprising:
   (a) a first control gain generator for calculating an associated first gain sequence for each of said plurality of voice signals, said associated first gain sequence dependent upon the corresponding voice signal;
   (b) a plurality of first multipliers each associated with each of said voice signals, each of said multipliers multiplying its associated voice signal with said associated first gain sequence to provide a first compressed voice signal from each of said plurality of first multipliers;
   (c) at least one modulator for modulating pairs of said first compressed voice signal to produce at least one independent single sideband signal;
   (d) a second control gain generator for calculating a second gain sequence for each of said at least one independent single sideband signals;
   (e) at least one second multiplier for multiplying said second gain sequence with said independent single sideband signal to form at least one second compressed voice signal; and
   (f) at least one third multiplier for multiplying each of said at least one second compressed voice signals with an assigned predetermined carrier frequency to provide an output signal for broadcast.

14. The apparatus of claim 13 further including a first bandpass filter for filtering said first compressed voice signal and a second bandpass filter for filtering said second compressed voice signal so as to limit the bandwidth thereof to a predetermined value.

15. The apparatus of claim 13 further including an interpolator for interpolating said second compressed voice signal prior to multiplication to said carrier frequency.

16. The apparatus of claim 13 wherein more than one said output signal is produced and further including a summer for frequency multiplexing said output signals into a multichannel output signal.

17. The apparatus of claim 13 further including:
   (a) a third control gain generator for calculating a third gain sequence from said output signal; and
   (b) a third multiplier for multiplying said third gain sequence with said output signal to form a compressed output signal.

18. The apparatus of claim 17 wherein said first, second, and third control gain generators calculate the digital gain sequence in accordance with:
   (a) calculating a first constant ($c_1$) based upon a predetermined sampling frequency and a first predetermined time constant;
   (b) calculating a second constant ($c_2$) based upon said predetermined sampling frequency and a second predetermined time constant;
   (c) calculating a filter response signal based as:

$$a(n)=c_1 a(n-1)+(1-c_1)x(n),$$

where n is an integer and x(n) is a digitized representation of each of said plurality of voice signals in the case of the first digital gain sequence and each of said independent single sideband signals in the case of the second digital gain sequence;

(d) calculating an intermediate function as:

$$p(n)=a(n) \text{ if } a(n)>p(n-1)$$

$$p(n)=c_2 p(n-1) \text{ if } a(n) \leq p(n-1); \text{ and}$$

(e) calculating the gain sequence as:

$$g(n)=\text{MAXLEVEL}/p(n),$$

where MAXLEVEL is a predetermined constant.

* * * * *